(12) United States Patent
Shen

(10) Patent No.: US 7,340,669 B2
(45) Date of Patent: Mar. 4, 2008

(54) MEMORY EFFICIENT STREAMLINED TRANSMITTER WITH A MULTIPLE INSTANCE HYBRID ARQ

(75) Inventor: Qiang Shen, San Diego, CA (US)

(73) Assignee: VIA Telecom Co., Ltd., San Diego, CA (US)

( * ) Notice: Subject to any disclaimer, the term of this patent is extended or adjusted under 35 U.S.C. 154(b) by 404 days.

(21) Appl. No.: 11/078,751

(22) Filed: Mar. 11, 2005

(65) Prior Publication Data

US 2006/0206777 A1    Sep. 14, 2006

(51) Int. Cl.
*H03M 13/03* (2006.01)
(52) U.S. Cl. .................................... 714/786
(58) Field of Classification Search ............... 714/702, 714/786
See application file for complete search history.

(56) References Cited

U.S. PATENT DOCUMENTS

| | | | | |
|---|---|---|---|---|
| 6,119,264 A * | 9/2000 | Berrou et al. | ............... | 714/786 |
| 6,304,991 B1 * | 10/2001 | Rowitch et al. | ............ | 714/755 |
| 6,553,516 B1 * | 4/2003 | Suda et al. | ................. | 714/702 |
| 6,571,366 B1 | 5/2003 | Doetsch et al. | ............ | 714/751 |
| 6,637,000 B2 | 10/2003 | Rowitch et al. | ............ | 714/755 |
| 6,954,885 B2 * | 10/2005 | Hurt et al. | ................... | 714/701 |
| 2005/0160347 A1 * | 7/2005 | Kim et al. | ................... | 714/776 |

\* cited by examiner

*Primary Examiner*—Shelly Chase
(74) *Attorney, Agent, or Firm*—Christopher P. Maiorana, PC

(57) ABSTRACT

An apparatus comprising a first circuit, a second circuit and a third circuit. The first circuit may be configured to generate an output signal in response to a first intermediate signal and a second intermediate signal. The second intermediate signal comprises a series of bit pairs. The second circuit comprises a first and a second encoder and may be configured to generate the second intermediate signal in response to a third intermediate signal. The third circuit may be configured to generate the first intermediate signal and the third intermediate signal in response to a first address signal and a second address signal. The third circuit comprises a first multiplexer and a second multiplexer.

16 Claims, 6 Drawing Sheets

MEMORY EFFICIENT STREAMLINED TRANSMITTER WITH A MULTIPLE INSTANCE HYBRID ARQ

FIELD OF THE INVENTION

The present invention relates to a method and/or architecture for implementing a transmitter generally and, more particularly, to a memory efficient streamlined transmitter with a multiple instance hybrid ARQ.

BACKGROUND OF THE INVENTION

For reliable data transmission over noisy physical channels, conventional systems often implement a Hybrid ARQ method. In such a system, the transmitter starts by transmitting a portion of an encoded packet (i.e., a subpacket). If the receiver successfully receives and decodes the encoded packet, the transmission of this packet is complete and the transmitter starts to transmit a portion of next encoded packet. If the transmitted subpacket is not successfully decoded, the transmitter either transmits another portion of the encoded packet or transmits the same portion of the encoded packet again. The receiver has two options when receiving a new subpacket for the previously failed subpacket. The receiver can discard the previously received subpacket and decode the newly received subpacket. Alternatively, the receiver can combine the newly received subpacket with the previously received subpacket and then perform decoding.

Because of the round-trip delay for a receiver to decode a subpacket and acknowledge back to the transmitter the success or failure of the decoding, the transmitter usually keeps multiple ARQ instances. When multiple ARQ instances are used, the transmitter transmits the next encoded packet before receiving ACK/NAK (acknowledge/ not acknowledge) of the last encoded packet. To achieve this, the transmitter has to keep all outstanding ARQ instances accessible.

Referring to FIG. 1, an example of such a conventional implementation is shown illustrating IS2000 release C and D, where the base station and mobile station each have up to 4 ARQ instances. In IS2000 release D, a mobile station will keep 4 ARQ instances of data packets with the maximum packet size being MaxEP=18456 bits. The maximum size of a subpacket that is to be transmitted is MaxSP=27648 bits. Data packets are turbo encoded with code rate ⅕, using two ⅓ constituent RSC encoders. A turbo encoder is implemented as a parallel concatenated encoder with an internal interleaver memory equal to the size of a data packet. The encoder has 5-bits of output per information bit. The output is sent to one of two banks of buffers for subpacket interleaving and interlacing.

Turbo encoding and subpacket interleaving and interlacing are further explained in FIG. 2 and FIG. 3. FIG. 2 shows a conventional turbo encoder 10. The turbo encoder 10 comprises a turbo interleaver 12, a constituent encoder 14 and a constituent encoder 16. Encoded bits are generated in 5 streams (i.e., S, P0, P1, P0' and P1'), resulting in 5 data blocks. Each of the data blocks has length equal to the size of the information packets.

The 5 data blocks are interleaved and interlaced as shown in FIG. 3, the result of which is an encoded packet of having a size of 5×EPSize. When transmitting, only a portion (usually continuous) of the whole encoded packet is transmitted. Such a portion is normally called a subpacket. Different portions of the encoded packet form different subpackets.

In general, a subpacket is only a subset of the total encoded symbols. To save interleaving and interlacing memory, only the subpacket symbols are saved into memory. Because of interleaving and interlacing, encoded symbols for a certain subpacket are not sequentially selected at the encoder output. Out of every 5 coded symbols, between 0 and all 5 symbols belong to a specific subpacket: The data rate from the turbo encoder to the interleaver memory is a variable. Directly connecting the turbo encoder output to the interleaving and interlacing memory increases design complexity and reduces hardware efficiency.

Another drawback to such a conventional approach is that the turbo interleaver memory inside the turbo encoder is virtually a replica of buffer used for multiple instance ARQ, causing inefficient and/or redundant use of memory.

It would be desirable to implement memory efficient streamlined transmitter architecture with multiple instance hybrid ARQ.

SUMMARY OF THE INVENTION

The present invention concerns an apparatus comprising a first circuit, a second circuit and a third circuit. The first circuit may be configured to generate an output signal in response to a first intermediate signal and a second intermediate signal. The second intermediate signal comprises a series of bit pairs. The second circuit comprises a first and a second encoder and may be configured to generate the second intermediate signal in response to a third intermediate signal. The third circuit may be configured to generate the first intermediate signal and the third intermediate signal in response to a first address signal and a second address signal. The third circuit comprises a first multiplexer and a second multiplexer.

The objects, features and advantages of the present invention include providing memory efficient streamlined transmitter architecture that may (i) implement a multiple instance hybrid ARQ, (ii) implement memory sharing between turbo interleaving and multiple instance ARQ, (iii) provide alternate clocking of two constituent encoders, (iv) implement a memory arrangement of a transmission buffer based on the maximum subpacket size, and/or (v) provide re-grouping of turbo encoded symbols to save transmission subpacket buffer address space.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
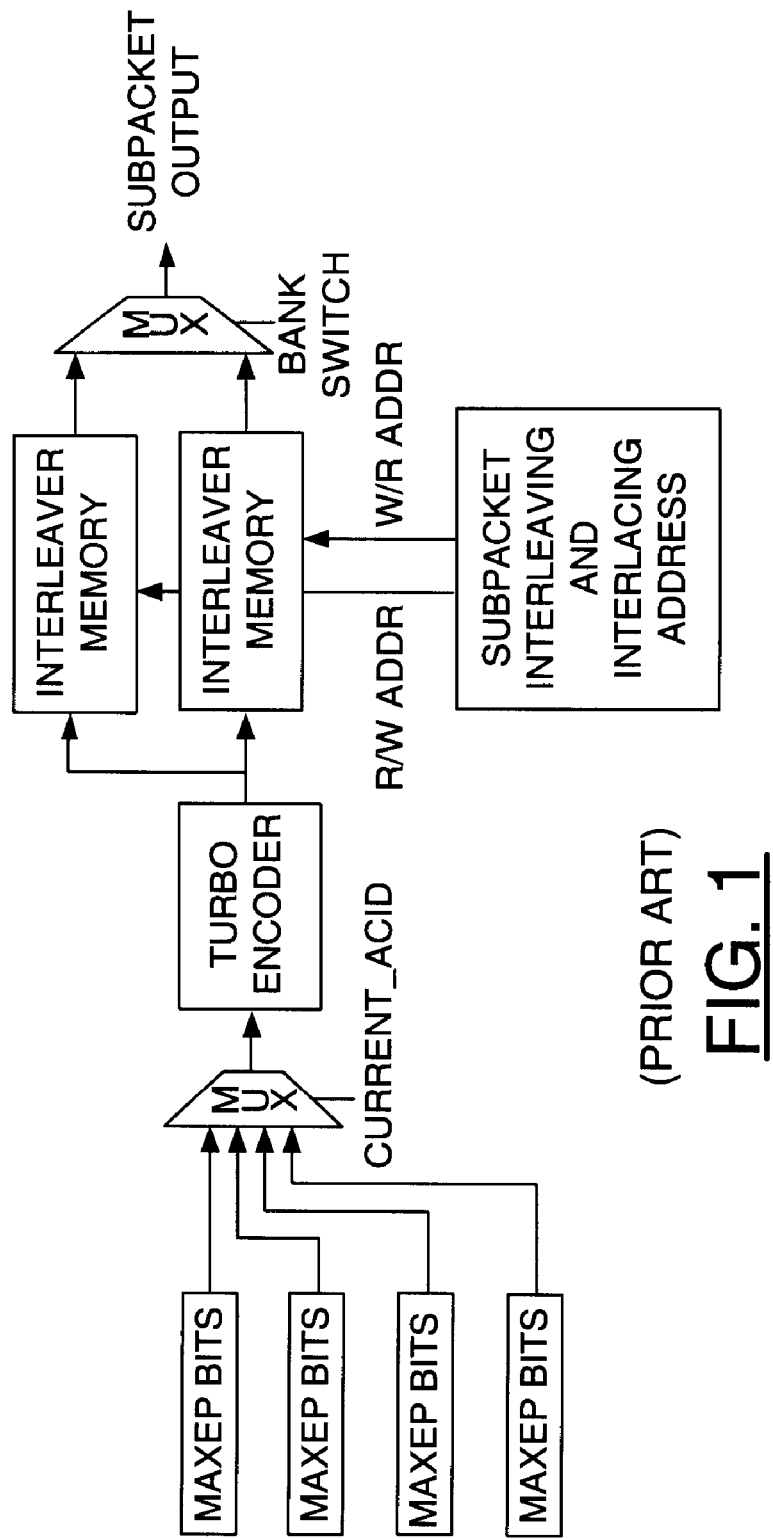
FIG. 1 is a block diagram of a conventional transmitter.
Figure 2:
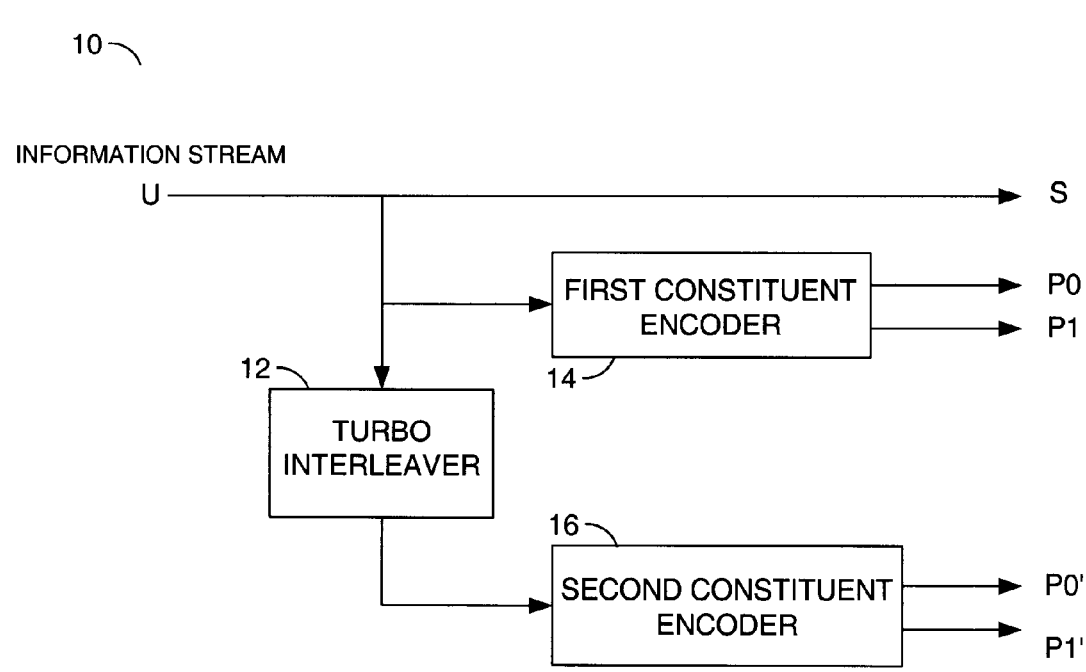
FIG. 2 is a block diagram of a conventional turbo encoder.
Figure 3:
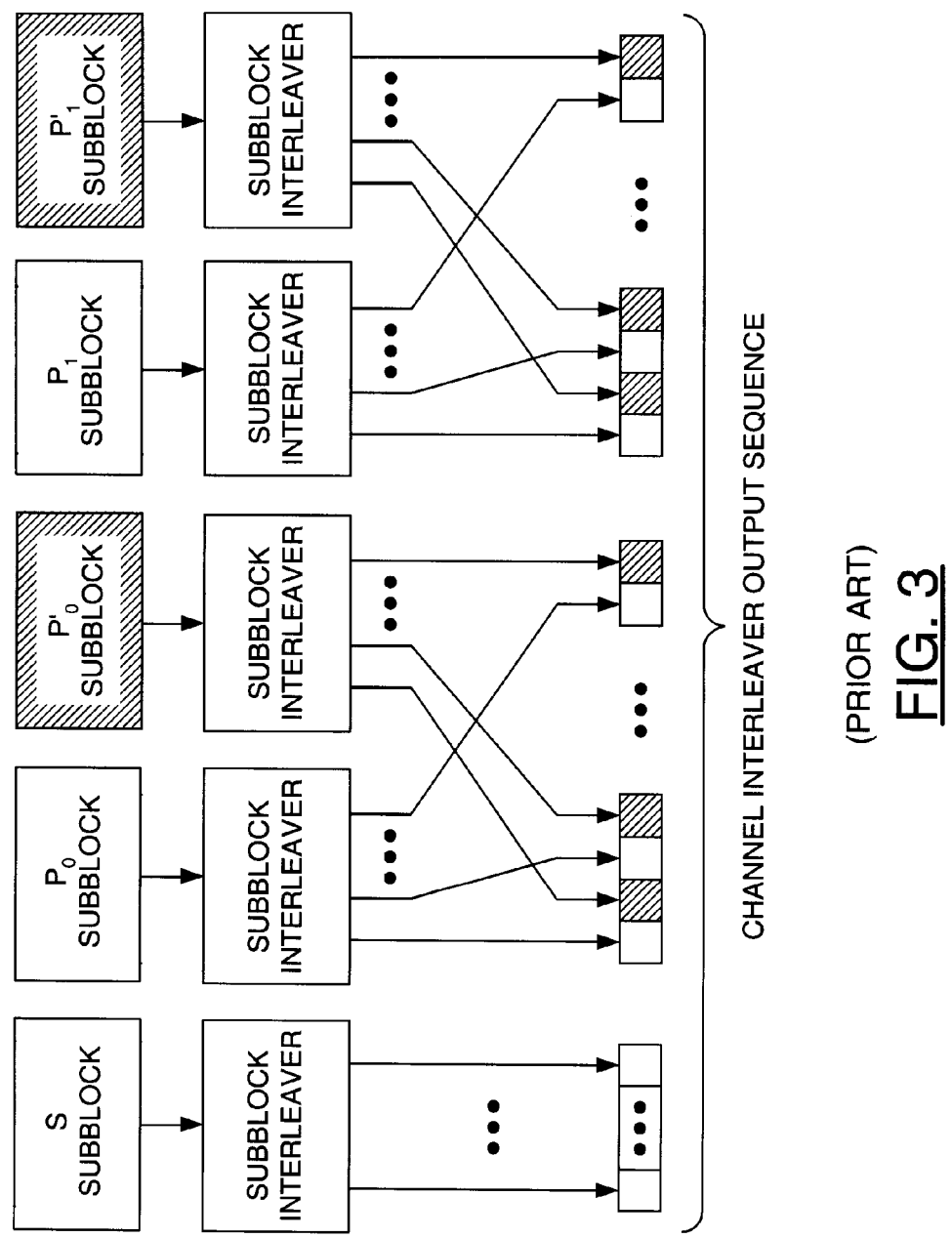
FIG. 3 is a block diagram of a conventional subpacket interleaving and interlacing configuration.
Figure 4:
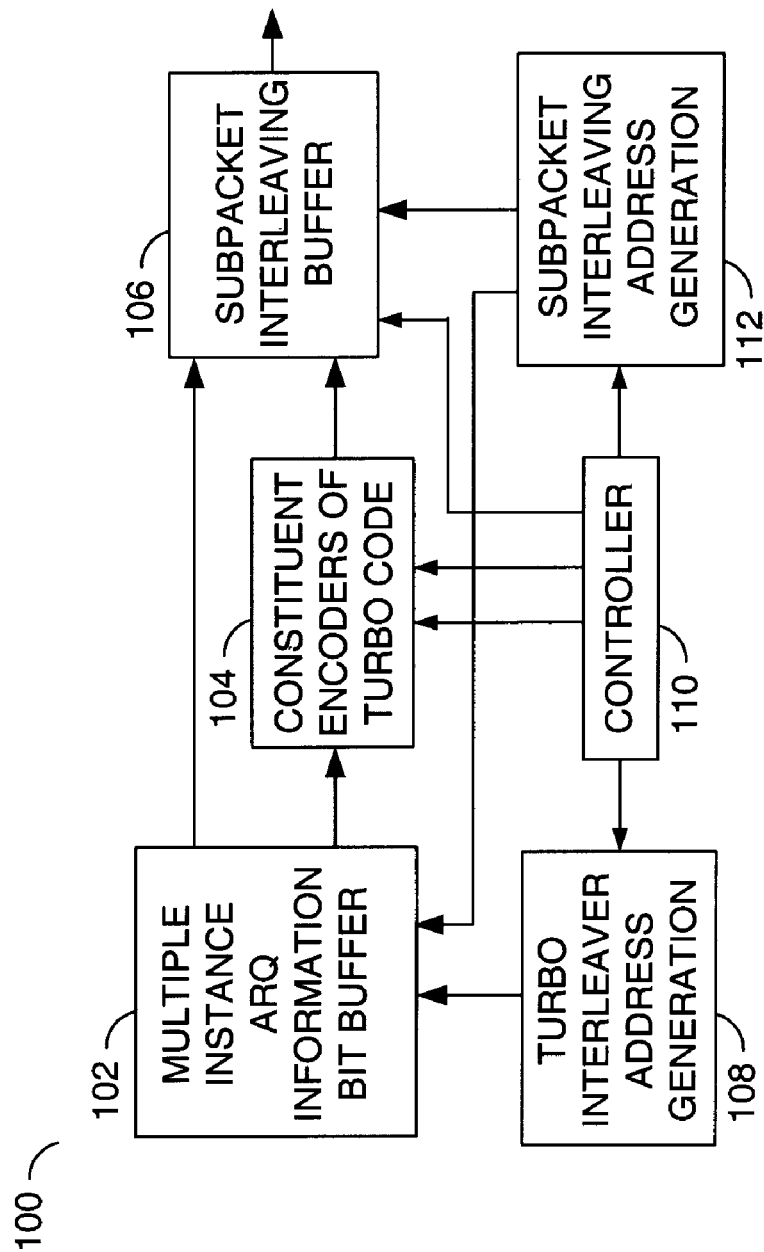
FIG. 4 is a block diagram of a preferred embodiment of the present invention.

Referring to FIG. 4, a block diagram of a system 100 is shown in accordance with a preferred embodiment of the present invention. The system 100 may be implemented as memory efficient streamlined transmitter with a multiple instance hybrid automatic repeat request (ARQ). The system 100 generally comprises a block (or circuit) 102, a block (or circuit) 104, a block (or circuit) 106, a block (or circuit) 108, a block (or circuit) 110 and a block (or circuit) 112. The circuit 102 may be implemented as a multiple instance ARQ information bit buffer. The circuit 104 may be implemented as one or more constituent encoders of turbo code. The circuit 106 may be implemented as a subpacket interleaving buffer. The circuit 108 may be implemented as a turbo interleaver address generation circuit. The circuit 110 may be implemented as a controller. The circuit 112 may be implemented as a subpacket interleaving address generation circuit.

The present invention may be illustrated in the context of an IS2000 release D mobile station transmitter implementation. However, the present invention may be applied to other implementation scenarios.

Figure 5:
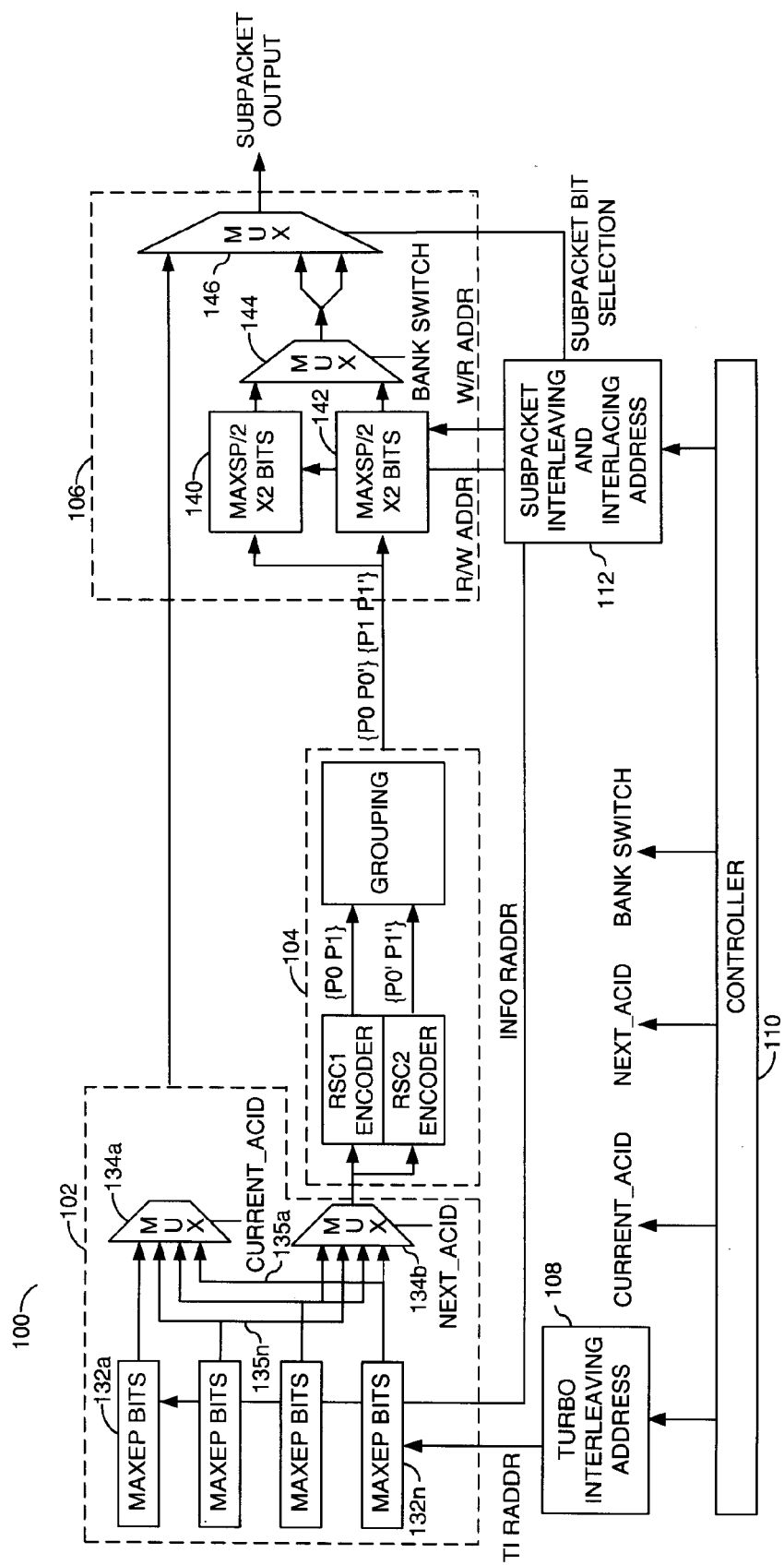
FIG. 5 is a more detailed diagram of the present invention.

Referring to FIG. 5, a more detailed diagram of the system 100 is shown. The circuit 102 may be implemented as a number of blocks 132a-132n, a multiplexer 134a and a multiplexer 134b. The blocks 132a-132n generally represent banks of memories configured to store information bits received from a data source. Each memory bank 132a-132n may be accessed by the address generation circuit 108 and the address generation circuit 112. Two multiplexers 134a and 134b are shown connected to the blocks 132a-132n with an address bus having bits 135a-135n. In practice, the address bus gets connected to each of the blocks 132a-132n. The multiplexers 134a-134b are used to switch between the blocks 132a-132n.

A bank of memory blocks 132a-132n each have a size equal to a maximum data packet size (e.g., MaxEP bits) and are set aside to store the information packet of outstanding ARQ instances. Each memory block 132a-132n may be implemented as one or more memory storage elements. The multiplexers 134a and 134b are used to choose data among the 4 memory blocks 132a-132n. The multiplexers 134a and 134b are controlled by select signals (e.g., CURRENT_ACID and NEXT_ACID. The select signal CURRENT_ACID={0,1,2,3} represents the index of the current ARQ instance, and the select signal NEXT_ACID={0,1,2,3} represents the index of the next ARQ instance.

Figure 6:
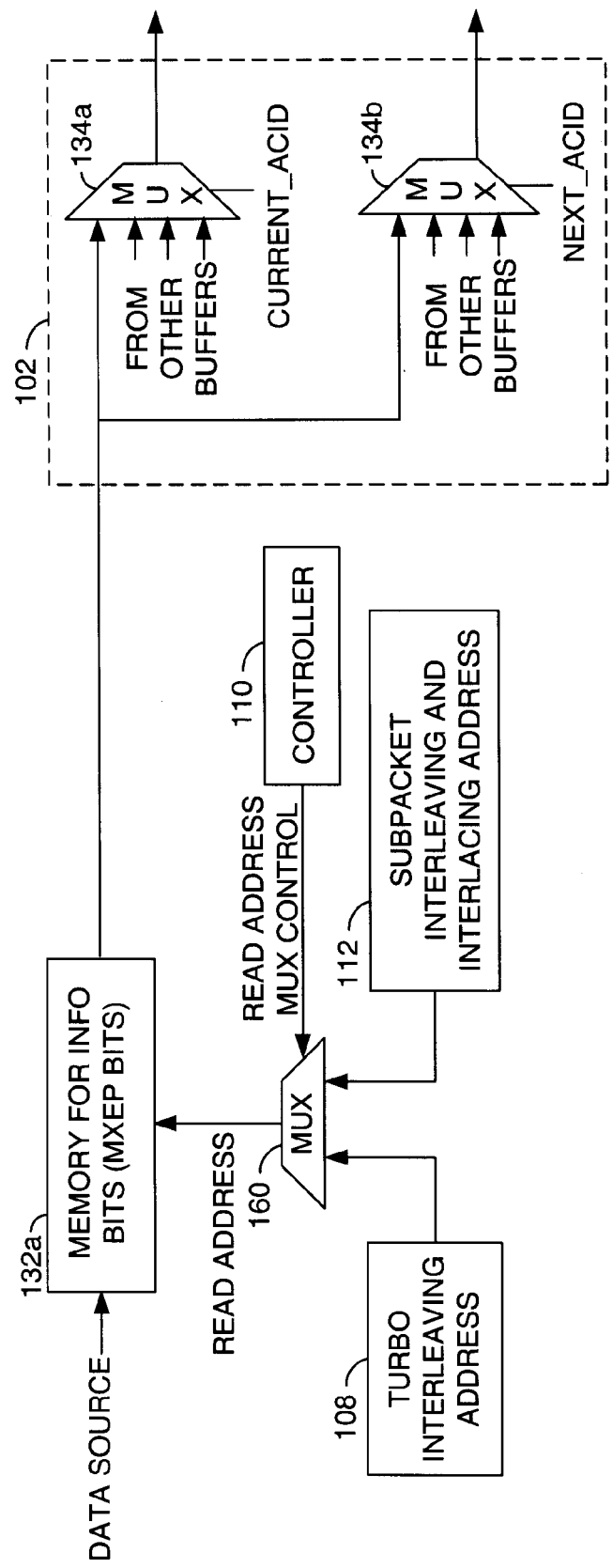
FIG. 6 is a more detailed diagram of an individual information bit memory.

Each of the memory banks 132a-132n is accessed by two address buses, one from turbo interleaving address unit 108, and another from the subpacket interleaving and interlacing address unit 112. The two address buses are multiplexed with a multiplexer 160 into the address input of the memory blocks 132a-132n, as shown in FIG. 6. In general, a multiplexer 160 may be implemented for each of the memory blocks 132a-132n. For plotting simplicity, in FIG. 5 the address buses are not shown connected to all of the memory blocks 132a-132n. An example scenario is illustrated where only two memories are connected with address buses, with the top memory for current transmission (e.g., CURRENT_ACID=0) and bottom memory for next transmission (NEXT_ACID=3).

The control signals CURRENT_ACID, NEXT_ACID, and control signals for address bus muxes (shown in FIG. 6) should coordinate such that correct address is presented to the memory blocks 132a-132n, with a corresponding data output being selected by the data multiplexers 134a-134n.

The turbo encoder 104 is broken down into two substantially similar constituent recursive systematic code (RSC) encoders RSC1 and RSC2. The two encoders RSC1 and RSC2 are clocked alternatively. Each of the encoders RSC1 and RSC2 operates once every two clock cycles. The turbo interleaving address unit 108 determines which information bit is read out and fed to the encoder 104. When the encoder RSC1 is clocked, the information bits are read out sequentially. For the encoder RSC2, the information bits are read out according to turbo interleaving order. For every two cycles, there are 4 parity check bits available.

The encoder RSC1 presents bits P0 and P1. The encoder RSC2 presents bits P0' and P1'. The bits are grouped into 2-bit words shown as {P0P0'} and {P1P1'}. The 2 bits in each word are normally either both transmitted or not transmitted for code balance. Depending on whether these two words belong to the subpacket to be transmitted, the subpacket interleaving and interlacing address unit 112 determines whether these two words are saved into the interleaver buffer 106. The read and write addresses from the unit 112 are generated according to interleaving order such that when read out, the symbols are intereleaved.

The circuit 106 may be implemented as a block (or circuit) 140, a block (or circuit) 142, a block (or circuit) 144) and a block (or circuit) 146. The circuit 140 and the circuit 142 may be implemented as encoded symbol buffers. The interleaver memory 140 and 142 operate alternatively in read and write modes for each subpacket transmission duration. Because only those coded symbols that belong to the selected subpacket are saved into the interleaver memory 106, the size is equal to a maximum subpacket size (MaxSP) bits, or MaxSP/2 2-bit words, since two bits are written and read together. Since MaxSP<5*MaxEP, this results in memory saving. The 2-bit word format saves address space, resulting in a further memory efficiency.

Two banks of interleaver memories 140 and 142 are used, one for transmitting the current subpacket, and another for generating the next subpacket. For transmitting a subpacket, the systematic bits S are directly read from the ARQ data packet memory banks 132a-132n. The particular bit read is controlled by the info read address from the subpacket interleaving and interlacing address unit 112.

A bank switch signal from the control logic 110 selects (through the multiplexer 144) which of the interleaver memories 140 and 142 that the current_ACID reads data from. The data are {P0, P0'} or {P1,P1'}, and they are passed to a second multiplexer 146, which accepts both systematic bits and parity check bits, and sends them in the order to form the correct subpacket. The control logic 110 generates all necessary control signals to coordinate all above operations.

The present invention has the following advantages of (i) being implemented without a Turbo interleaver memory, (ii) providing a structured subpacket buffer with reduced address space, and (iii) providing a streamlined data flow in which data rate is fixed, thus removing the necessity of handshaking signals among blocks. The information bit memory for the ARQ instances are served for other purposes of turbo interleaving and subpacket transmission of systematic bits.

In one example, the present invention may be used in a CDMA2000 or WCDAM mobile communication system. However, the present invention may be easily implemented in other designs.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a first circuit configured to generate an output signal in response to a first intermediate signal and a second intermediate signal, wherein said second intermediate signal comprises a series of bit pairs;
   a second circuit (i) comprising a first and a second encoder and (ii) configured to generate said second intermediate signal in response to a third intermediate signal; and
   a third circuit configured to generate said first intermediate signal and said third intermediate signal in response to a first address signal and a second address signal, wherein said third circuit comprises a first multiplexer and a second multiplexer.

2. The apparatus according to claim 1, wherein said first and said second encoder are configured in parallel.

3. The apparatus according to claim 1, wherein said apparatus further comprises:
   a first address generation circuit configured to generate said first address signal.

4. The apparatus according to claim 3, wherein said apparatus further comprises:
   a second address generation circuit configured to generate said second address signal.

5. The apparatus according to claim 3, wherein said first address generation circuit comprises a turbo interleaving address generator.

6. The apparatus according to claim 4, wherein said first address generation circuit comprises a subpacket interleaving and interlacing address generator.

7. The apparatus according to claim 1, further comprising:
   a control circuit configured provide control signals to said first address generation circuit and said second address generation circuit.

8. The apparatus according to claim 1, wherein said first circuit further comprises a first buffer and a second buffer.

9. The apparatus according to claim 1, wherein said third circuit further comprises a plurality of memory storage elements.

10. The apparatus according to claim 9, wherein each of said plurality of memory storage elements receive an address signal from either said first address generation circuit or said second address generation circuit, wherein said address is selected using a multiplexer.

11. The apparatus according to claim 10, wherein multiplexer is controlled by a signal from a control circuit.

12. An apparatus comprising:
    means for generating an output signal in response to a first intermediate signal and a second intermediate signal, wherein said second intermediate signal comprises a series of bit pairs;
    means for generating said second intermediate signal in response to a third intermediate signal using a first and a second encoder; and
    means for generating said first intermediate signal and said third intermediate signal in response to a first address signal and a second address signal using a first multiplexer and a second multiplexer.

13. A method transmitting data comprising the steps of:
    (A) generating an output signal in response to a first intermediate signal and a second intermediate signal, wherein said second intermediate signal comprises a series of bit pairs;
    (B) generating said second intermediate signal in response to a third intermediate signal using a first and a second encoder; and
    (C) generating said first intermediate signal and said third intermediate signal in response to a first address signal and a second address signal using a first multiplexer and a second multiplexer.

14. The method according to claim 13, wherein said first and said second encoder are configured in parallel.

15. The method according to claim 13, wherein said method further comprises the steps of:
    generating said first address signal with a first address generating circuit.

16. The method according to claim 13, wherein said method further comprises:
    generating said second address signal with a second address generation circuit.

* * * * *